June 3, 1969 HANS-JÜRGEN BREUER 3,448,400

ARRANGEMENT FOR VARYING THE FEEDBACK OF AN AMPLIFIER

Filed Nov. 30, 1967

INVENTOR
HANS-JÜRGEN BREUER
BY Hane and Baxley
ATTORNEYS

United States Patent Office 3,448,400

Patented June 3, 1969

3,448,400

ARRANGEMENT FOR VARYING THE FEEDBACK OF AN AMPLIFIER

Hans-Jürgen Breuer, Alvsjo, Sweden, assignor to Telefonaktiebolaget L M Ericsson, Stockholm, Sweden, a corporation of Sweden Filed Nov. 30, 1967, Ser. No. 686,909
Claims priority, application Sweden, Jan. 24, 1967, 1,039/67
Int. Cl. H03f 1/36, 3/52
U.S. Cl. 330—109 1 Claim

ABSTRACT OF THE DISCLOSURE

The present invention relates to an arrangement for decreasing the feedback of a reverse feedback amplifier with increasing frequency and for increasing the feedback with decreasing frequency in order to vary the amplification when a signal is supplied through a load impedance, for example a line with frequency dependent attenuation. The feedback variation is accomplished by means of a bridge circuit having frequency dependent impedances in opposite arms thereof, a load impedance in another arm, and an impedance in the remaining arm which has a value equal to the load impedance. One bridge diagonal is connected to the amplifier output terminals and the other diagonal contains an impedance having a value equal to the load impedance. The inverse feedback path is connected from one terminal of the said other diagonal to the input of the amplifier.

In a conventional reverse feedback amplifier one often wants a small amplification at low frequencies and a large amplification at high frequencies in order to counteract the frequency dependent attenuation in cables. In order to obtain this change in amplification it is necessary that the feedback decreases with increasing frequency, which is achieved by connecting a frequency-dependent network, for example a shunted T-link, to the feedback circuit, so that in the feedback circuit a small attenuation is obtained at low frequencies and a large attenuation at high frequencies. Since a low amplification is desired at low frequencies, a high consumption of energy will be obtained in the feedback circuit, which consumption remains unchanged also at higher frequencies.

The purpose of the invention is to decrease the consumption of energy with increasing frequency in the feedback circuit of a reverse feeding amplifier. Thus it will be possible to transfer part of the available output effect of the amplifier, increasing with the frequency, to a load impedance, for example a transmission cable.

A feedback circuit according to the invention is characterized by an alternating current bridge, to whose one pair of diagonal points the two output terminals of the amplifier are connected, one side of said bridge comprising said load impedance, and the opposite side and the remaining diagonal each containing an impedance, the value of the impedance belonging to the first-mentioned side being equal to the value of the load impedance, the two remaining sides containing an impedance the value of which increases with the frequency and an impedance the value of which decreases with the frequency, respectively, one of the terminals of the diagonal impedance being connected to the load impedance, the other being connected to the input circuit of the amplifier and the product of the values of the two frequency dependent impedances being equal to the square value of the load impedance. By means of an arrangement according to the invention the outgoing impedance of the reverse feedback amplifier can furthermore, when said diagonal impedance is dimensioned in a suitable way, be kept constant when the frequency varies, and it will be equal to the load impedance, so that no particular matching impedance is required.

Figure 1:
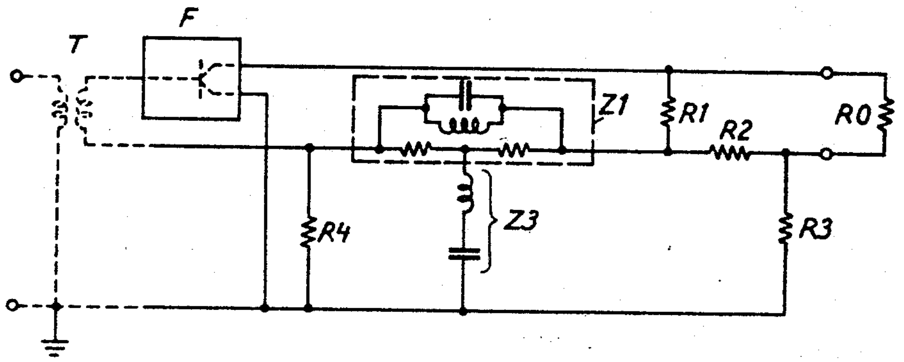
Figure 2:
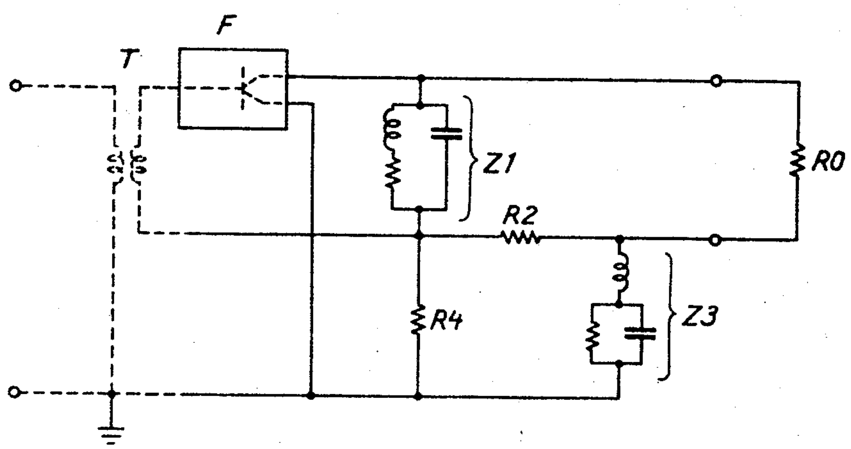

The invention will be described more in detail below with reference to the accompanying drawing in which FIG. 1 shows an amplifier with a conventional feedback circuit, FIG. 2 shows an amplifier with a feedback circuit according to the principle of the invention.

In FIG. 1 an amplifier with a conventional frequency dependent feedback circuit is shown. The amplifier is indicated as a transistor amplifier F. The input signal is supplied through a transformer to the base of the transistor in the amplifier. One of the output terminals of the amplifier is connected to one of the terminals of the load circuit R0 and the other output terminal is connected to the other terminal of the load circuit through a resistance R3. Parallel to the load circuit two resistances R1 and R2 are connected in series. The point between the resistance R1 and the resistance R2 is connected to the input of the amplifier through the horizontal part Z1 of a shunted T-link. The other output terminal of the amplifier is connected to the vertical part Z3 of the T-link and through a resistance R4 also connected to the input of the amplifier. With increasing frequency the impedance of the part Z1 increases and the impedance of the part Z3 decreases, in consequence of which the feedback decreases while the energy consumed by the feedback circuit remains constant. Thus a high consumption of energy is obtained in the feedback circuit also at high frequencies when simultaneously the need of energy in the cable is great.

In FIG. 2 an amplifier with a frequency dependent feedback circuit according to the principle of the invention is shown. The amplifier is in conformity with the one indicated in FIG. 1 indicated as a transistor amplifier F, to the base of which the input signal is supplied through a transformer T. One of the output terminals of the amplifier is connected to one of the terminals of the load circuit R0 and the other terminal of the output is connected through a frequency dependent impedance Z3 the value of which decreases with increasing frequency, to the other terminal of the load circuit. To said one terminal of the load circuit a frequency dependent impedance Z1 is connected, the value of which increases with increasing frequency, and the other terminal is connected through an impedance R2 which according to the example is equal to R0, to said other terminal of the load circuit.

The point between the impedance Z1 and the impedance R2 is connected to the input circuit of the amplifier and is also connected to the other output terminal of the amplifier through an impedance R4 which is equal to R0. The common point of said other terminal of the amplifier output, between the impedance R4 and the impedance Z3, is connected to a reference point having a fixed potential, according to the example ground potential. By selecting the components Z1, Z3, R0 and R4 in the manner described above the network formed by these can be regarded as an alternating-current bridge that is balanced within the frequency range in question. Upon increasing the frequency the impedance Z1 will increase while the impedance Z3 will decrease as is mentioned above and the voltage at the two terminals of the impedance R2 will change with the same value, so that no current will pass through this impedance. The voltage from the connecting point between the impedance Z1 and the impedance R4 is applied to the input of the amplifier as a feedback voltage. It it easy to understand that the feedback voltage will decrease with increasing frequency, due to the frequency dependence of the impedance Z1. By increasing the value of the impedance Z1 the current passing through this impedance and through the impedance R4 will decrease and consequently the consumption of energy will decrease with increasing frequency when the need of energy in the load circuit is greater. By means of an arrangement according to the invention the impedance at the output terminals of the amplifier may have values varying within wide limits. According to the example, the value of the diagonal impedance is equal to the value of the load impedance R0 in order to match the reverse feedback amplifier to its load. This, however, is not absolutely necessary in order to achieve the saving of energy in the feedback circuit which is intended by the invention.

I claim:

1. Arrangement for decreasing the feedback of a reverse feedback amplifier with increasing frequency and for increasing the feedback with decreasing frequency in order to vary the amplification when a signal is supplied through a load impedance, for example a line with frequency dependent attenuation, including an alternating current bridge, said amplifier having one output terminal connected to a corner point and another output terminal connected to another corner point diagonally opposed to said first corner point in said bridge, one side of said bridge comprising said load impedance (R0) and the opposite side and the diagonal extending between the remaining two corner points each containing an impedance, the value of the impedance belonging to the first-mentioned side being equal to the value of the load impedance (R0), the two remaining sides containing an impedance (Z1) the value of which increases with the frequency and an impedance (Z3) the value of which decreases with the frequency respectively, one of the terminals of the impedance inserted in said diagonal being connected to the load impedance, the other being connected to the input of the amplifier and the product of the values of the two frequency dependent impedances (Z1, Z3) being equal to the square value of the load impedance (R0).

References Cited

UNITED STATES PATENTS 3,131,361 4/1964 Brewer ------------- 330—109

JOHN KOMINSKI, *Primary Examiner.*

JAMES B. MULLINS, *Assistant Examiner.*

U.S. Cl. X.R.

330—28, 31